United States Patent
Umehara et al.

(10) Patent No.: US 12,095,442 B2
(45) Date of Patent: Sep. 17, 2024

(54) COMPOSITE SUBSTRATE, PIEZOELECTRIC DEVICE, AND METHOD FOR MANUFACTURING COMPOSITE SUBSTRATE

(71) Applicant: KYOCERA Corporation, Kyoto (JP)

(72) Inventors: Motohiro Umehara, Yasu (JP); Kuniaki Mitsuda, Omihachiman (JP); Kazuyoshi Fujimoto, Yasu (JP)

(73) Assignee: Kyocera Corporation, Kyoto (JP)

(*) Notice: Subject to any disclaimer, the term of this patent is extended or adjusted under 35 U.S.C. 154(b) by 650 days.

(21) Appl. No.: 17/278,612

(22) PCT Filed: Sep. 24, 2019

(86) PCT No.: PCT/JP2019/037272
§ 371 (c)(1),
(2) Date: Mar. 22, 2021

(87) PCT Pub. No.: WO2020/067013
PCT Pub. Date: Apr. 2, 2020

(65) Prior Publication Data
US 2022/0021368 A1    Jan. 20, 2022

(30) Foreign Application Priority Data
Sep. 25, 2018 (JP) .................. 2018-178801
Sep. 27, 2018 (JP) .................. 2018-181814

(51) Int. Cl.
*H03H 9/02* (2006.01)
*H03H 3/08* (2006.01)

(52) U.S. Cl.
CPC .......... *H03H 9/02574* (2013.01); *H03H 3/08* (2013.01); *H03H 9/02559* (2013.01)

(58) Field of Classification Search
CPC .................. H03H 9/02574; H03H 9/02559
(Continued)

(56) References Cited

U.S. PATENT DOCUMENTS

| | | | |
|---|---|---|---|
| 2002/0047497 A1 | 4/2002 | Higuchi et al. | |
| 2005/0194864 A1 | 9/2005 | Miura et al. | |

(Continued)

FOREIGN PATENT DOCUMENTS

| | | | |
|---|---|---|---|
| JP | 5-48383 A | 2/1993 | |
| JP | H11-122073 A | 4/1999 | |

(Continued)

OTHER PUBLICATIONS

Kim et al., "Thermal Expansion of Lithium Tantalate and Lithium Niobate Single Crystals", Journal of Applied Physics 40, 4637 (1967), https://doi.org/10.1063/1.1657244, May 5, 1969, 6 pages.
(Continued)

*Primary Examiner* — Derek J Rosenau
(74) *Attorney, Agent, or Firm* — Procopio, Cory, Hargreaves & Savitch LLP

(57) ABSTRACT

A composite substrate of the present disclosure includes a piezoelectric substrate having a first surface which is an element formation surface and a second surface which is a back surface of the first surface, a sapphire substrate having a third surface which is disposed opposing a second surface and a fourth surface which is a back surface of the third surface, a fifth surface opposing the second surface, and a sixth surface opposing the third surface. It includes an alumina layer bonding the second surface and the third surface, and an arithmetic mean roughness Ra of the third surface is 0.1 μm or more and 0.5 μm or less. The arithmetic mean roughness Ra of the fifth surface is 0.1 μm or less and is smaller than the arithmetic mean roughness Ra of the third surface.

12 Claims, 4 Drawing Sheets

(58) Field of Classification Search
USPC ..... 310/313 R, 313 A, 313 B, 313 C, 313 D, 310/348
See application file for complete search history.

(56) References Cited

U.S. PATENT DOCUMENTS

| | | |
|---|---|---|
| 2015/0357551 A1 | 12/2015 | Teshigahara et al. |
| 2018/0048282 A1 | 2/2018 | Kurimoto et al. |
| 2019/0036009 A1* | 1/2019 | Tai .......................... H03H 3/10 |
| 2019/0280666 A1 | 9/2019 | Akiyama et al. |
| 2019/0288661 A1 | 9/2019 | Akiyama et al. |

FOREIGN PATENT DOCUMENTS

| | | |
|---|---|---|
| JP | 2002-176331 A | 6/2002 |
| JP | 2005-252550 A | 9/2005 |
| JP | 2010-161697 A | 7/2010 |
| JP | 2014-147054 A | 8/2014 |
| JP | 2015-230244 A | 12/2015 |
| JP | 2018-26695 A | 2/2018 |
| JP | 2018-61226 A | 4/2018 |
| WO | 2017/163722 A1 | 9/2017 |
| WO | 2018/016169 A1 | 1/2018 |

OTHER PUBLICATIONS

Kyocera Corporation, "Single Crystal Sapphire", 2020, BNSDOCID: <XP 55917113A, 8 pages.
Dingquan et al., "Thin Film Physics And Devices", Jul. 9, 2024, National Planning Textbooks for the "Eleventh Five-Year Plan" og General Higher Education, ISBN 978-7-118-07238-9, 10 pages.

* cited by examiner

COMPOSITE SUBSTRATE, PIEZOELECTRIC DEVICE, AND METHOD FOR MANUFACTURING COMPOSITE SUBSTRATE

TECHNICAL FIELD

The present disclosure relates to a composite substrate having a structure in which a piezoelectric substrate and a sapphire substrate are bonded, a piezoelectric device having the composite substrate, and a method for manufacturing the composite substrate.

BACKGROUND ART

In recent years, there has been a demand for miniaturization and higher performance of piezoelectric devices such as surface acoustic wave devices used in communication devices such as mobile phones. As a small and high performance piezoelectric device, it is suggested that a piezoelectric device has a structure in which an element electrode is formed on a piezoelectric substrate of a composite substrate where the piezoelectric substrate and a support substrate are bonded. A sapphire substrate has superior mechanical strength, insulation, and heat dissipation which makes it a superior support substrate.

In the composite substrate, spurious caused by the reflection of bulk waves at the bonding interface between the piezoelectric substrate and the support substrate is a problem. To solve this problem, Patent Document 1 discloses a composite substrate in which the surface of a support substrate is roughened by a lapping process. In addition, Patent Document 2 discloses a composite substrate using a support substrate in which a pyramid-shaped concavo-convex structure is formed by wet etching. However, there is a problem that as the surface roughness of the support substrate is increased to reduce the reflection of bulk waves, the bonding strength between the support substrate and the piezoelectric substrate is reduced.

PRIOR ART DOCUMENTS

Patent Documents

Patent Document 1: Japanese Unexamined Patent Publication No. 2014-147054
Patent Document 2: Japanese Unexamined Patent Publication No. 2018-61226

SUMMARY OF THE INVENTION

Problem to be Solved by the Invention

The present disclosure aims to provide a composite substrate and a piezoelectric device in which the bonding strength between a piezoelectric substrate and a support substrate is high and the reflection of bulk waves at the bonding surface is reduced.

Means for Solving the Problem

The composite substrate of the present disclosure includes a piezoelectric substrate having a first surface which is an element forming surface and a second surface which is a back surface of the first surface, a sapphire substrate having a third surface which is disposed opposing the second surface and a fourth surface which is a back surface of the third surface, a fifth surface opposing the second surface, and a sixth surface opposing the third surface. It includes an alumina layer which bonds the second surface and the third surface, and an arithmetic mean roughness Ra of the third surface is 0.1 μm or more and 0.5 μm or less. The arithmetic mean roughness Ra of the fifth surface is 0.1 μm or less and is smaller than the arithmetic mean roughness Ra of the third surface.

The method for manufacturing a composite substrate of the present disclosure includes a preparing a piezoelectric substrate having a first surface which is an element forming surface and a second surface which is a back surface of the first surface and a sapphire substrate having a third surface and a fourth surface which is a back surface of the third surface; a roughening the third surface so as to have an arithmetic mean roughness Ra of 0.1 μm or more and 0.5 μm or less; an alumina layer forming an alumina layer formed on the roughened third surface, and the fifth surface which is an exposed surface located on the opposite side of the sapphire substrate of the alumina layer is processed so as to have an arithmetic mean roughness Ra of 0.1 μm or less and to be smaller than the arithmetic mean roughness Ra of the third surface; and a bonding the fifth surface of the alumina layer directly bonded to the second surface of the piezoelectric substrate.

The composite substrate of the present disclosure is composed of a material selected from the group consisting of a piezoelectric substrate having a first surface which is an element forming surface and a second surface which is a back surface of the first surface, a sapphire substrate having a third surface which is disposed opposing the second surface and a fourth surface which is a back surface of the third surface, and an oxide having the same material as the piezoelectric substrate, alumina, and a thermal expansion coefficient intermediate between the piezoelectric substrate and alumina. It includes a fifth surface opposing the second surface, a sixth surface opposing the third surface, and a bonding layer which bonds the second surface and the third surface, in which an arithmetic mean roughness Ra of the second surface is 0.1 μm or more and 0.5 μm or less, and the arithmetic mean roughness Ra of the sixth surface is 0.1 μm or less and is smaller than the arithmetic mean roughness Ra of the second surface.

The method for manufacturing a composite substrate of the present disclosure includes a preparing a piezoelectric substrate having a first surface which is an element forming surface and a second surface which is a back surface of the first surface and a sapphire substrate having a third surface and a fourth surface which is a back surface of the third surface; a roughening the second surface so as to have an arithmetic mean roughness Ra of 0.1 μm or more and 0.5 μm or less; a bonding layer forming a bonding layer composed of a material selected from the group consisting of the same material as the piezoelectric substrate, alumina, and an oxide having a thermal expansion coefficient intermediate between the piezoelectric substrate and alumina is formed on the roughened second surface, and the sixth surface which is an exposed surface located on the opposite side of the piezoelectric substrate of the bonding layer so as to have an arithmetic mean roughness Ra of 0.1 μm or less and to be smaller than the arithmetic mean roughness Ra of the second surface; and a bonding the sixth surface of the bonding layer directly bonded to the third surface of the sapphire substrate.

Effects of the Invention

According to the present disclosure, it is possible to provide a composite substrate and a piezoelectric device in which the bonding strength between a piezoelectric substrate and a support substrate is high and the reflection of bulk waves at the bonding surface is reduced.

EMBODIMENTS FOR CARRYING OUT THE INVENTION

Composite Substrate and Piezoelectric Device

Figure 1:
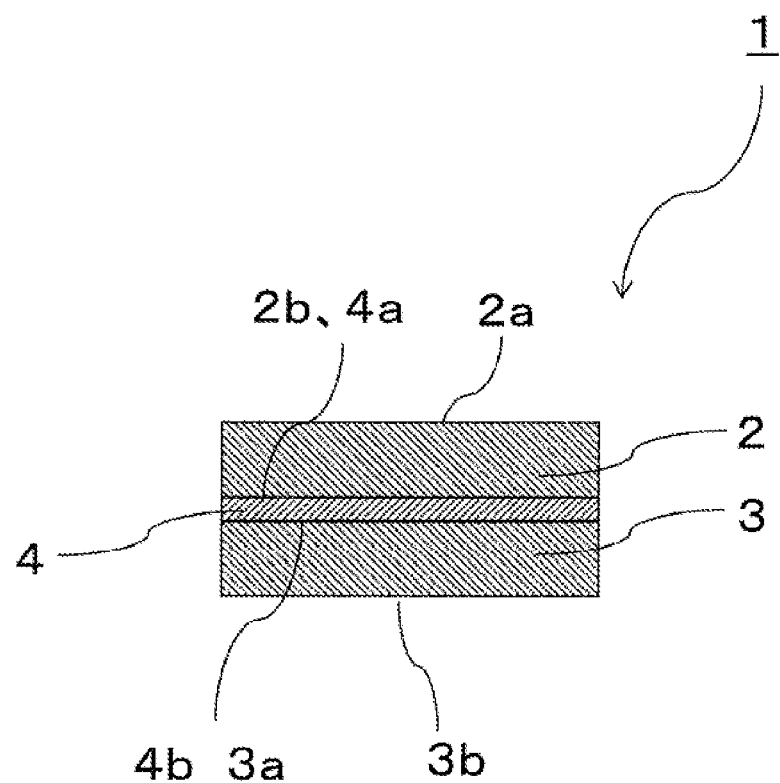
FIG. 1 is a schematic sectional view showing the composite substrate according to one embodiment of the present disclosure.

The composite substrate and piezoelectric device according to the one embodiment of the present disclosure are explained with reference to the figures. FIG. 1 shows a schematic sectional view of a composite substrate 1 according to the one embodiment. The composite substrate 1 has a piezoelectric substrate 2 having a first surface 2a which is an element forming surface and a second surface 2b which is a back surface of it, a sapphire substrate 3 having a third surface 3a which is disposed opposing the second surface 2b, and a bonding layer 4 which bonds the second surface 2b and the third surface 3a. The bonding layer 4 is composed of any of the same material as the piezoelectric substrate 2, alumina, or an oxide having a thermal expansion coefficient intermediate between the piezoelectric substrate 2 and alumina. In FIG. 1, the bonding layer 4 is explained as an "alumina layer 4" composed of alumina. The arithmetic mean roughness Ra of the third surface 3a of the sapphire substrate 3 is 0.1 µm or more and 0.5 µm or less, and the arithmetic mean roughness Ra of the fifth surface 4a, which is the surface on the piezoelectric substrate 2 side of the alumina layer 4, is 0.1 µm or less and is smaller than the arithmetic mean roughness Ra of the third surface 3a.

The piezoelectric device according to the one embodiment of the present disclosure includes the composite substrate 1 according to the one embodiment. The piezoelectric device includes an oscillator used in an oscillation circuit or the like and an acoustic wave device such as a surface acoustic wave device, a boundary acoustic wave device, a bulk wave device or the like, used in a filter circuit or the like. The second surface 2b and the third surface 3a are opposed to each other through the alumina layer 4, as described above.

Hereinafter, the composite substrate 1 according to the one embodiment is explained in detail. The composite substrate 1 according to the one embodiment includes the piezoelectric substrate, the sapphire substrate 3, and the alumina layer 4. The piezoelectric substrate 2 has the first surface 2a which is the element forming surface and the second surface 2b which is the back surface of it and is bonded to the alumina layer 4. The sapphire substrate 3 has a third surface 3a which is disposed opposing the second surface 2b of the piezoelectric substrate 2 and the fourth surface 3b which is the back surface of it. The alumina layer 4 has the fifth surface 4a in contact with the second surface 2b of the piezoelectric substrate 2 and the sixth surface 4b in contact with the third surface 3a of the sapphire substrate 3. The alumina layer 4 bonds the piezoelectric substrate 2 to the sapphire substrate 3 without adhesives or the like.

An element electrode is formed on the first surface 2a of the piezoelectric substrate 2 and is used as the composite substrate 1 for the piezoelectric device such as the surface acoustic wave device. For convenience, the explanation below is based on an example in which the piezoelectric substrate 2 is a substrate for a surface acoustic wave device. The piezoelectric substrate 2 is not limited to this but may be a substrate for other applications or functions such as a substrate for a sensor of a vibration sensor or the like or a substrate for an oscillator.

In the composite substrate 1 according to the one embodiment, the first surface 2a is the element forming surface of the element electrode or the like, the second surface 2b and the third surface 3a are the bonding surfaces, and the fourth surface 3b is the back surface. The element forming surface is a part where a functional part of the element electrode or the like is located, as described above. The element electrode is, for example, combtooth electrodes that are positioned so as to engage with each other. By the surface acoustic wave between the combtooth electrodes, filtering or the like of signals transmitted between the combtooth electrodes is performed.

Conventionally, a surface acoustic wave device including a composite substrate has a problem that noise called spurious is generated at frequency higher than a passband (a frequency band through which a band-pass filter passes signals without attenuation). The noise is caused by the reflection of bulk waves at the bonding interface between the piezoelectric substrate 2 and the sapphire substrate 3 which is a support substrate 3. Although it is known that the surface roughness of the bonding surface is increased to reduce the reflection of bulk waves, there is a problem that the bonding strength is reduced when the surface roughness of the bonding surface is increased.

In the composite substrate 1 according to the one embodiment, the arithmetic mean roughness Ra of the third surface 3a which is the bonding surface of the sapphire substrate 3 is 0.1 µm or more and 0.5 µm or less, particularly preferably 0.1 µm or more and 0.3 µm or less. Therefore, a part of the bulk arriving at the third surface 3a is absorbed or diffusely reflected, and the reflected bulk waves toward the element forming surface 2a (that is, a functional part of the element electrode or the like) are reduced. This can reduce spurious.

Further, in the composite substrate 1 according to the one embodiment, the arithmetic mean roughness Ra of the fifth surface 4a which is the surface on the piezoelectric substrate 2 side of the alumina layer 4 is 0.1 µm or less, preferably 0.01 µm or less. This can increase the strength of the bond between the sapphire substrate 3 and the alumina layer 4 and the piezoelectric substrate 2. Therefore, it is possible to provide the composite substrate 1 in which the bonding strength between the piezoelectric substrate 2 and the sapphire substrate 3 is high and the reflection of bulk waves at the third surface 3a which is the bonding surface is reduced.

The arithmetic mean roughness Ra can be measured, for example, by a laser microscope, a stylus type surface shape measuring instrument, an atomic force microscope (AFM), a scanning electron microscope (SEM) observation of the cross-section of the bonding part, a transmission electron microscope (TEM) observation, or the like. The measurement length is set to 5 μm or more, five points or more are measured in the surface, and the mean value is used as a measurement value.

The piezoelectric substrate 2 is composed of materials having piezoelectricity such as lithium tantalate (LT), lithium niobate (LN), zinc oxide, and quartz crystal. The first surface 2a of the piezoelectric substrate 2 can obtain good device characteristics if the arithmetic mean roughness Ra is 1 nm or less. If the second surface 2b has the arithmetic mean roughness Ra of 0.01 μm or less, the bonding strength with the alumina layer 4' is increased.

Sapphire is a single crystal alumina. In the sapphire substrate 3, the third surface 3a and the fourth surface 3b' are specific crystal planes such as a c-plane, a-plane, m-plane, r-plane, or the like, or crystal planes having a predetermined off-angle to these crystal planes. If the fourth surface 3b of the sapphire substrate 3 has the arithmetic mean roughness Ra of 1 μm or more, the reflection of bulk waves on the fourth surface 3b can be reduced, which is effective in improving device characteristics.

The alumina layer 4 is composed of alumina, same as the sapphire substrate 3. Therefore, compared to the case in which bonding layers of different materials are used, the residual stress or the like at the time of bonding caused by differences in physical properties such as the thermal expansion coefficient and elastic modulus due to differences in materials can be reduced. If the alumina layer 4 is a polycrystal or amorphous, the reflection of bulk waves can be reduced because the regularity of the atomic arrangement is lower than a single crystal. Whether the alumina layer 4 is the single crystal, polycrystal, or amorphous can be determined by methods such as X-ray diffraction and electron diffraction. From the viewpoint of bonding strength and reduction of reflected waves at the bonding part, the thickness of the alumina layer 4 may be 0.5 μm or more and 5 μm or less.

Although it is considered that the composite substrate includes the sapphire substrate (not shown) in which the surface part of the piezoelectric substrate side is processed in order to reduce the reflection of bulk waves or the like, the composite substrate 1 according to the one embodiment is different from this. For example, when the third surface 3a of the sapphire substrate 3 is machined using a lapping device or the like, a processing altered layer in which a large number of crystal defects are introduced is formed. In addition, when atoms (or ions) are driven into the sapphire substrate 3 from the third surface 3a, an ion (atom) implanted layer is formed. The alumina layer 4 of the present disclosure differs from the processing altered layer or the ion (atom) implanted layer in that the third surface 3a of the sapphire substrate 3 has the arithmetic mean roughness Ra of 0.1 μm or more and 0.5 μm or less, the third surface 3a is bonded to the alumina layer 4 (the sixth surface 4b), and the relatively smooth fifth surface 4a of the alumina layer 4 is bonded to the piezoelectric substrate 2.

Figure 2:
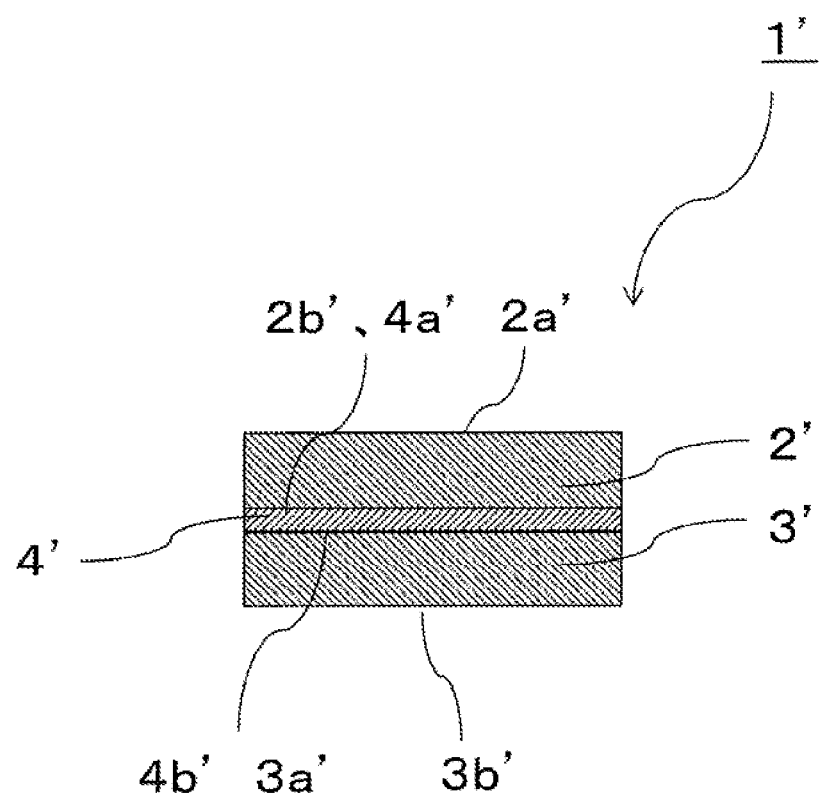
FIG. 2 is a schematic sectional view showing the composite substrate according to another embodiment of the present disclosure.

Next, the composite substrate and piezoelectric device according to another embodiment of the present disclosure are explained with reference to the figures. FIG. 2 shows a schematic sectional view of a composite substrate 1' according to another embodiment. The composite substrate 1' according to another embodiment includes a piezoelectric substrate 2' having a first surface 2a' which is the element forming surface and a second surface 2b' which is the back surface of it, a sapphire substrate 3' having a third surface 3a' disposed opposing the second surface 2b', and a bonding layer 4' which is composed of any of the same material as the piezoelectric substrate 2', alumina, or an oxide having the thermal expansion coefficient intermediate between the piezoelectric substrate 2' and alumina and which bonds the second surface 2b' and the third surface 3a'. The arithmetic mean roughness Ra of the second surface 2b' of the piezoelectric substrate 2' is 0.1 μm or more and 0.5 μm or less, and the arithmetic mean roughness Ra of the sixth surface 4b' which is the surface on the sapphire substrate 3' side of the bonding layer 4' is 0.1 μm or less and is smaller than the arithmetic mean roughness Ra of the second surface 2b'.

The piezoelectric device according to another embodiment of the present disclosure includes a composite substrate 1' according to another embodiment. As for the piezoelectric device, it is as described above, and the detailed explanation is omitted. The second surface 2b' and the third surface 3a' are opposed to each other through the bonding layer 4', as described above.

Hereinafter, the details of the composite substrate 1' according to another embodiment are explained. The composite substrate 1' according to another embodiment includes the piezoelectric substrate 2', the sapphire substrate 3', and the bonding layer 4'. The piezoelectric substrate 2' has the first surface 2a' which is the element forming surface and the second surface 2b' which is the back surface of it and is bonded to the bonding layer 4'. The sapphire substrate 3' has the third surface 3a' which is disposed opposing the second surface 2b' of the piezoelectric substrate 2', and the fourth surface 3b' which is the back surface of it. The bonding layer 4' has a fifth surface 4a' in contact with the second surface 2b' of the piezoelectric substrate 2' and the sixth surface 4b' in contact with the third surface 3a' of the sapphire substrate 3'. The bonding layer 4' bonds the piezoelectric substrate 2' to the sapphire substrate 3' without adhesives or the like.

The element electrode is formed on the first surface 2a' of the piezoelectric substrate 2' and is used as the composite substrate 1' for the piezoelectric device such as the surface acoustic wave device. For convenience, the explanation below is based on an example in which the piezoelectric substrate 2' is a substrate for a surface acoustic wave device. The piezoelectric substrate 2' is not limited to this but may be a substrate for other applications or functions such as a substrate for a sensor of a vibration sensor or the like or a substrate for an oscillator.

In the composite substrate 1' according to another embodiment, the first surface 2a' is the element forming surface of the element electrode or the like, the second surface 2b' and the third surface 3a' are the bonding surfaces, and the fourth surface 3b' is the back surface. The element forming surface is a part where the functional part of the element electrode or the like is located, as described above. The element electrode is, for example, combtooth electrodes that are positioned so as to engage with each other. By the surface acoustic wave between the combtooth electrodes, filtering or the like of signals transmitted between the combtooth electrodes is performed.

Conventionally, a surface acoustic wave device including a composite substrate has a problem that noise called spurious is generated at frequency higher than a passband (a frequency band through which a band-pass filter passes signals without attenuation). The noise is caused by the reflection of bulk waves at the bonding interface between the piezoelectric substrate 2 and the sapphire substrate 3' which is the support substrate. Although it is known that the surface roughness of the bonding surface is increased to reduce the reflection of bulk waves, there is a problem that the bonding strength is reduced when the surface roughness of the bonding surface is increased.

In the composite substrate 1' according to another embodiment, the arithmetic mean roughness Ra of the second surface 2b' which is the bonding surface of the piezoelectric substrate 2' is 0.1 μm or more and 0.5 μm or less, particularly preferably 0.1 μm or more and 0.3 μm or less. Therefore, a part of the bulk arriving at the second surface 2b' is absorbed or diffusely reflected, and the reflected bulk waves toward the element forming surface 2a' (that is, a functional part of the element electrode or the like) are reduced. This can reduce spurious.

Further, in the composite substrate 1' according to another embodiment, the arithmetic mean roughness Ra of the sixth surface 4b' which is the surface on the sapphire substrate 3' side of the bonding layer 4' is 0.1 μm or less, preferably 0.01 μm or less. This can increase the strength of the bond between the piezoelectric substrate 2' and the bonding layer 4' and the sapphire substrate 3'. Therefore, it is possible to provide the composite substrate 1' in which the bonding strength between the piezoelectric substrate 2' and the sapphire substrate 3' is high and the reflection of bulk waves at the second surface 2b' which is the bonding surface is reduced. The measurement method of the arithmetic mean roughness Ra is described above, and the detailed explanation is omitted.

The piezoelectric substrate 2' is composed of materials having piezoelectricity such as lithium tantalate (LT), lithium niobate (LN), zinc oxide, and quartz crystal. The first surface 2a' of the piezoelectric substrate 2' can obtain good device characteristics if the arithmetic mean roughness Ra is 1 nm or less.

Sapphire is the single crystal alumina. In the sapphire substrate 3', the third surface 3a' and the fourth surface 3b' are specific crystal planes such as a c-plane, a-plane, m-plane, r-plane, or the like, or crystal planes having a predetermined off-angle to these crystal planes. If the third surface 3a' of the sapphire substrate 3' has the arithmetic mean roughness Ra of 0.01 μm or less, the bonding strength with the bonding layer 4' is increased. In addition, if the fourth surface 3b' of the sapphire substrate 3 has the arithmetic mean roughness Ra of 1 μm or more, the reflection of bulk waves on the fourth surface 3b' can be reduced, which is effective in improving device characteristics.

The bonding layer 4' is composed of any of the same material as the piezoelectric substrate 2', alumina, or an oxide having the thermal expansion coefficient intermediate between the piezoelectric substrate 2' and alumina. If the bonding layer 4' is the same material as the piezoelectric substrate 2', thermal stress and thermal strain which are caused by the formation temperature (for example, several hundred degrees) when forming the bonding layer 4' on the piezoelectric substrate 2' can be reduced. On the other hand, if the bonding layer 4' is alumina which is the same as the sapphire substrate 3', thermal stress and thermal strain which occur depending on the bonding temperature (for example, approximately from several tens of °C. to about 150° C.) when bonding the bonding layer 4' to the sapphire substrate 3' can be reduced. In addition, if the bonding layer 4' is an oxide having the thermal expansion coefficient intermediate between the piezoelectric substrate 2' and alumina, thermal stress and thermal strain which occur at the time of forming the bonding layer 4' or bonding with the sapphire substrate 3' can be reduced.

The thermal expansion coefficient of the single crystal material differs depending on the crystal orientation, and the thermal expansion coefficient of the lithium niobate is 7.5 to 15 ppm/° C., and the thermal expansion coefficient of lithium tantalate is 4 to 16 ppm/° C. An x-axis of a lithium tantalate substrate which is rotated at an angle of 36° to 46° from a y-axis around the x-axis, that is, the direction of surface acoustic wave propagation is approximately 16 ppm/° C. In addition, the thermal expansion coefficient of sapphire is 7.0 to 7.7 ppm/° C. For example, if the thermal expansion coefficient of the piezoelectric substrate 2' and the sapphire substrate 3' is 16 ppm/° C. and 7 ppm/° C., a material whose thermal expansion coefficient is 7 to 16 ppm/° C. may be used as the bonding layer 4'. A material having such a thermal expansion coefficient includes, for example, silica (the thermal expansion coefficient of single crystal silica is 7.5 to 14 ppm/° C.).

If the bonding layer 4' is the polycrystal or amorphous, the reflection of bulk waves can be reduced because the regularity of the atomic arrangement is lower than the single crystal. Whether the bonding layer 4' is the single crystal, polycrystal, or amorphous can be determined by methods such as X-ray diffraction and electron diffraction. From the viewpoint of bonding strength and reduction of reflected waves at the bonding part, the thickness of the bonding layer 4' may be 0.5 μm or more and 5 μm or less.

It is considered that the composite substrate includes the sapphire substrate (not shown) in which the surface part of the piezoelectric substrate side is processed in order to reduce the reflection of bulk waves or the like. However, the composite substrate 1' according to another embodiment differs from this. When atoms (or ions) are driven into the sapphire substrate 3 from the third surface 3a', an ion (atom) implanted layer is formed. In the bonding layer 4' of the present disclosure, the second surface 2b' of the piezoelectric substrate 2' has the arithmetic mean roughness Ra of 0.1 μm or more and 0.5 μm or less, and the second surface 2b' is bonded to the bonding layer 4 (the fifth surface 4a). Furthermore, the relatively smooth sixth surface 4b' of the bonding layer 4' is bonded to the sapphire substrate 3'. In these respects, it differs from the processing altered layer and the ion (atom) implanted layer.

Method for Manufacturing Composite Substrate

Figure 3A:
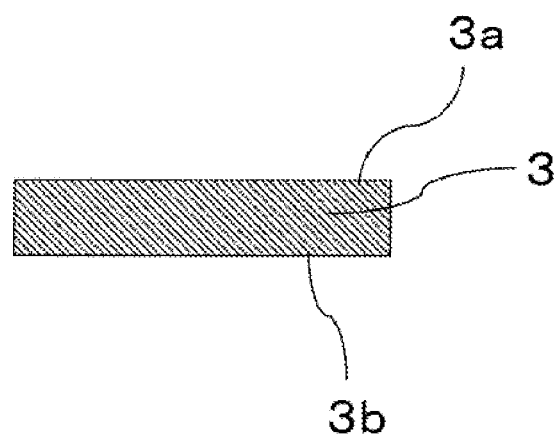
FIG. 3 is a schematic sectional view showing one embodiment of the method for manufacturing a composite substrate according to the present disclosure.
Figure 3B:
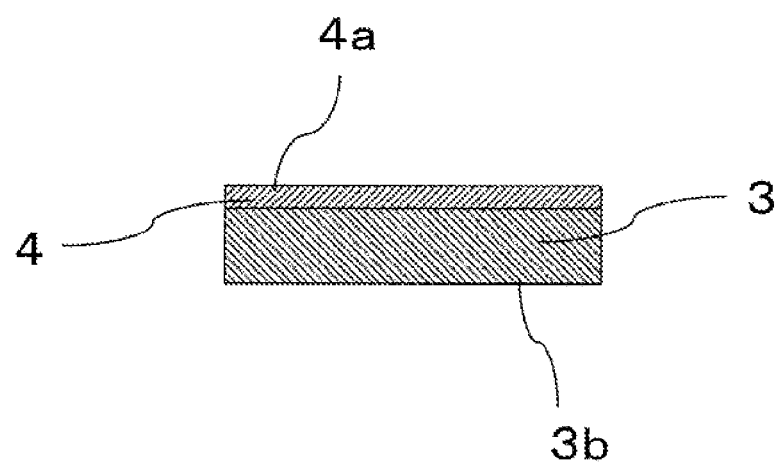
Figure 3C:
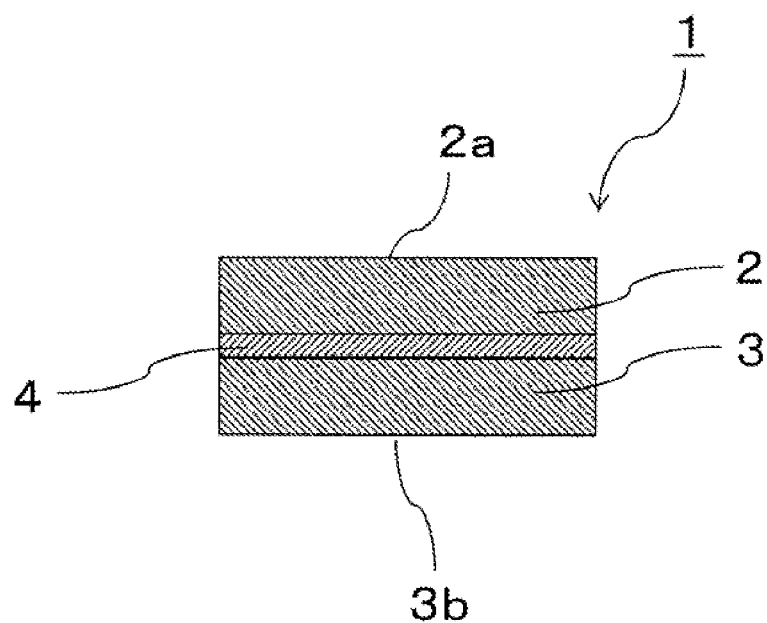

Next, the method for manufacturing the composite substrate according to one embodiment of the present disclosure is explained with reference to the figures. FIG. 3 shows a schematic explanatory view of the method for manufacturing the composite substrate according to one embodiment. The method for manufacturing the composite substrate according to one embodiment includes the below steps (1) to (4). By the below steps (1) to (4), the composite substrate 1 according to one embodiment, for example, as shown in FIG. 1 can be manufactured. A composite layer 4, as described in steps (3) and (4) below, is composed of any of the same material as the piezoelectric substrate 2, alumina, or an oxide having the thermal expansion coefficient intermediate between the piezoelectric substrate 2 and alumina.

(1) is a preparation step in which the piezoelectric substrate 2 having the first surface 2a which is the element forming surface and the second surface 2b which is the back surface of it and the sapphire substrate having the third surface 3a and the fourth surface 3b which is the back surface of it are prepared.

(2) is a roughening step in which the third surface 3 of the sapphire substrate 3 is processed so as to have the arithmetic mean roughness Ra of 0.1 μm or more and 0.5 μm or less.

(3) is a bonding layer forming step in which the bonding layer 4 is formed on the roughened third surface 3a and the fifth surface 4a, which is the exposed surface located on the opposite side of the sapphire substrate 3 of the bonding layer 4, is processed so as to have the arithmetic mean roughness Ra of 0.1 μm or less and to be smaller than the arithmetic mean roughness Ra of the third surface 3a.

(4) is a bonding process in which the fifth surface 4a of the composite layer 4 is directly bonded to the second surface 2b of the piezoelectric substrate 2.

Hereinafter, the details of the method for manufacturing the composite substrate of the present disclosure are explained. In FIG. 3, the bonding layer 4 is described as the "alumina layer 4" composed of alumina. First, the piezoelectric substrate 2 having the first surface 2a and the second surface 2b opposing each other and the sapphire substrate 3 having the third surface 3a and the fourth surface 3b opposing each other are prepared. The first surface 2a is the element forming surface, the second surface 2b and the third surface 3a are the bonding surfaces, and the fourth surface 3b is the back surface.

The sapphire substrate 3 is prepared by cutting an ingot-shaped or ribbon-shaped sapphire crystal grown by an appropriate growing method, such as the Czochralski method, so that the third surface 3a and fourth surface 3b have specific crystal planes, such as the c-plane, a-plane, m-plane, and r-plane, or a predetermined off-angle to these crystal planes.

The second surface 2b of the piezoelectric substrate 2 and the third surface 3a of the sapphire substrate 3 are planarized by the lapping process or the like using a surface plate made of copper, tin, iron, or the like and abrasive grains such as diamond, silicon carbide, boron carbide, or the like. If the third surface 3a is processed so as to have the arithmetic mean roughness Ra of 0.1 μm or more and 0.5 μm or less, particularly preferably 0.1 μm or more and 0.3 μm or less, the reflection of bulk waves can be reduced and the bonding strength is increased. If the arithmetic mean roughness Ra of the second surface 2b is 0.01 μm or less, it is desirable because the bonding strength with the alumina layer 4 can be increased.

Next, the alumina layer 4 is formed on the third surface 3a of the sapphire substrate 3. The alumina layer 4 can be formed by, for example, a PVD method such as vapor deposition and sputtering, and a CVD method such as metal organic chemical vapor deposition. By chemical mechanical polishing (CMP) using silica particles, and alkaline aqueous solution, the fifth surface 4a, which is the surface of the alumina layer 4, is polished so as to obtain a desired value of the arithmetic mean roughness Ra of 0.1 μm or less (for example, approximately 0.01 μm). By optimizing the formation method and formation condition of the alumina layer 4, if the arithmetic mean roughness Ra of the fifth surface 4a of the alumina layer 4 after film formation (as-grown) is a desired value of 0.1 μm or less (for example, 0.01 μm or less), the polishing step may be omitted.

Next, at least one of the second surface 2b of the piezoelectric substrate 2 and the fifth surface 4a of the alumina layer 4 is activated by a method such as plasma treatment. The alumina layer 4 and the piezoelectric substrate 2 are bonded by the direct bonding without using adhesive materials. For example, the piezoelectric substrate 2 and the sapphire substrate 3 in which the alumina layer 4 is formed are heated and/or pressured in a vacuum, in air, or in a predetermined atmosphere to diffuse atoms at the bonding interface, resulting in diffusion bonding. By the previous activation process, the temperature at the time of bonding can be lowered. Therefore, the causes of damage and poor processing accuracy due to the difference in thermal expansion coefficient between the piezoelectric substrate 2 and the sapphire substrate 3 can be reduced.

In the direct bonding of the piezoelectric substrate 2 and the alumina film 4, diffusion bonding by the diffusion of atoms between the piezoelectric substrate 2 and the alumina film 4 is used. If the arithmetic mean roughness Ra of the second surface 2b of the piezoelectric substrate 2 and the fifth surface 4a of the alumina layer 4 is 0.1 μm or less, the bonding strength is improved.

After bonding the piezoelectric substrate 2 and the sapphire substrate 3, the thickness of the sapphire substrate 3 may be thinned by using the lapping device or the like. In this case, the sapphire substrate 3 is removed from the fourth surface 3b side by the above process. The thickness of the piezoelectric substrate 2 may be thinned by using the lapping device or the like. It is suitable to process the first surface 2a of the piezoelectric substrate 2' using a CMP device or the like so that the arithmetic mean roughness Ra is 1 nm or less.

Figure 4A:
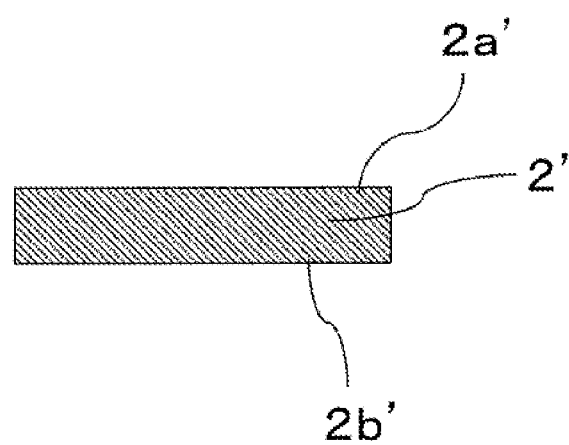
FIG. 4 is a schematic sectional view showing another embodiment of the method for manufacturing a composite substrate according to the present disclosure.
Figure 4B:
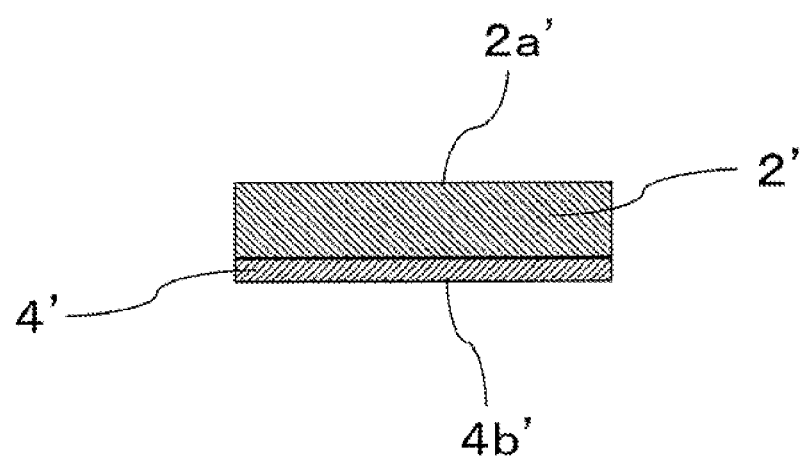
Figure 4C:
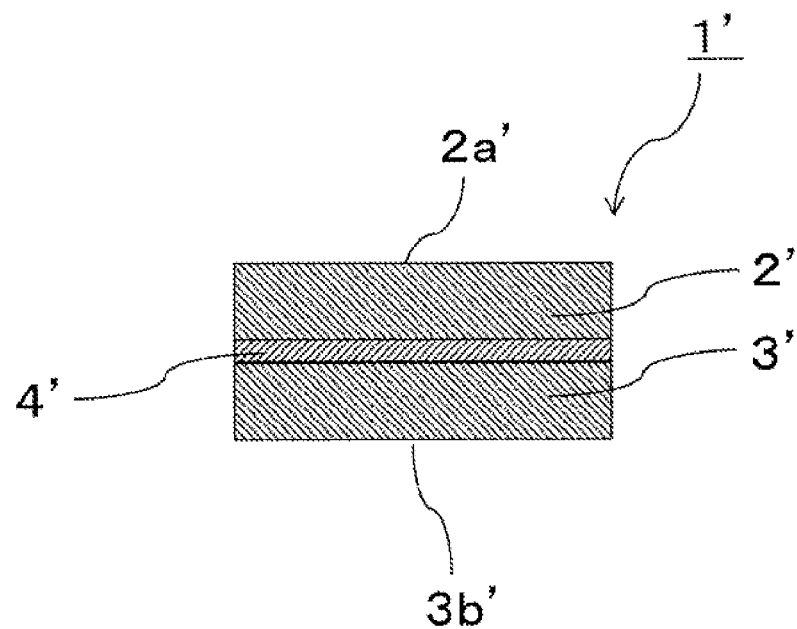

Hereinafter, the method for manufacturing the composite substrate according to another embodiment of the present disclosure is explained with reference to the figures. FIG. 4 shows a schematic explanatory view of the method for manufacturing the composite substrate according to another embodiment. The method for manufacturing the composite substrate according to another embodiment has the below steps (5) to (8). By the below steps (5) to (8), the composite substrate 1' according to another embodiment, for example, as shown in FIG. 2 can be manufactured.

(5) is a preparation step in which the piezoelectric substrate 2' having the first surface 2a', which is the element forming surface, and the second surface 2b', which is the back surface of it, and the sapphire substrate 3' having the third surface 3a' and the fourth surface 3b', which is the back surface of it, are prepared.

(6) is a roughening step in which the second surface 2b' of the piezoelectric substrate 2' is processed so as to have the arithmetic mean roughness Ra of 0.1 μm or more and 0.5 μm or less.

(7) is a bonding layer forming step in which the bonding layer 4', which is composed of any of the same material as the piezoelectric substrate 2', alumina, or an oxide having the thermal expansion coefficient intermediate between the piezoelectric substrate 2' and alumina is formed on the roughened second surface 2b', and the sixth surface 4b', which is the exposed surface located on the opposite side of the piezoelectric substrate 2' of the bonding layer 4', is processed so as to have the arithmetic mean roughness Ra of 0.1 μm or less and to be smaller than the arithmetic mean roughness Ra of the second surface 2b'.

(8) is a bonding step in which the sixth surface 4b' of the bonding layer 4' is directly bonded to the third surface 3a' of the sapphire substrate 3'.

The details of the method for manufacturing the composite substrate for the other embodiment is explained in the case where the piezoelectric substrate 2' is lithium tantalate and the bonding layer 4' is alumina. First, the piezoelectric substrate 2' composed of lithium tantalate single crystal having the first surface 2a' and the second surface 2b' opposed each other and the sapphire substrate 3' having the third surface 3a' and the fourth surface 3b' opposed each other are prepared. The first surface 2a' is the element forming surface, the second surface 2b' and the third surface 3a' are the bonding surfaces, and the fourth surface 3b' is the back surface.

The sapphire substrate 3' is prepared by cutting an ingot-shaped or ribbon-shaped sapphire crystal grown by an appropriate growing method, such as the Czochralski method, so that the third surface 3a' and fourth surface 3b' have specific crystal planes, such as the c-plane, a-plane, m-plane, and r-plane, or a predetermined off-angle to these crystal planes.

The second surface 2b' of the piezoelectric substrate 2' and the third surface 3a' of the sapphire substrate 3' are planarized by the lapping process or the like using the surface plate made of copper, tin, iron, or the like and abrasive grains such as diamond, silicon carbide, boron carbide, or the like. If the second surface 2b' is processed so as to have the arithmetic mean roughness Ra of 0.1 μm or more and 0.5 μm or less, particularly preferably 0.1 μm or more and 0.3 μm or less, the reflection of bulk waves can be reduced and the bonding strength is increased. If the arithmetic mean roughness Ra of the third surface 3a' is 0.01 μm or less, it is desirable because the bonding strength with the alumina layer 4' can be increased.

Next, the bonding layer 4' composed of alumina is formed on the second surface 2b' of the piezoelectric substrate 2'. The bonding layer 4' can be formed by, for example, a PVD method such as vapor deposition and sputtering, and a CVD method such as metal organic chemical vapor deposition. By chemical mechanical polishing (CMP) using silica particles, and alkaline aqueous solution, the sixth surface 4b', which is the surface of the bonding layer 4, is polished so as to obtain a desired value of the arithmetic mean roughness Ra of 0.1 μm or less (for example, approximately 0.01 μm). By optimizing the formation method and formation condition of the bonding layer 4', if the arithmetic mean roughness Ra of the sixth surface 4b' of the bonding layer 4' after film formation (as-grown) is a desired value of 0.1 μm or less (for example, 0.01 μm or less), the polishing step may be omitted.

Next, at least one of the third surface 3a' of the sapphire substrate 3' or the sixth surface 4b' of the bonding layer 4' is activated by the method such as the plasma treatment. The sapphire substrate 3 and the bonding layer 4' are bonded by the direct bonding without using adhesive materials. For example, the sapphire substrate 3' and the piezoelectric substrate 2' in which the bonding layer 4' is formed are heated and/or pressured in a vacuum, in air, or in a predetermined atmosphere to diffuse atoms at the bonding interface, resulting in diffusion bonding. By the previous activation process, the temperature at the time of bonding can be lowered. Therefore, the causes of damage and poor processing accuracy due to the difference in thermal expansion coefficient between the piezoelectric substrate 2' and the sapphire substrate 3' can be reduced.

In the direct bonding of the sapphire substrate 3' and the bonding layer 4', diffusion bonding by the diffusion of atoms between the sapphire substrate 3' and the bonding layer 4' is used. If the arithmetic mean roughness Ra of the third surface 3a' of the sapphire substrate 3' and the sixth surface 4b' of the bonding layer 4' is 0.1 μm or less, the bonding strength is improved.

After bonding the piezoelectric substrate 2' and the sapphire substrate 3', the thickness of the sapphire substrate 3' may be thinned by using the lapping device or the like. In this case, the sapphire substrate 3' is removed from the fourth surface 3b' side by the above process. The thickness of the piezoelectric substrate 2' may be thinned by using the lapping device or the like. It is suitable to process the first surface 2a' of the piezoelectric substrate 2' using a CMP device or the like so that the arithmetic mean roughness Ra is 1 nm or less. If the bonding layer 4' is composed of lithium tantalate or silica, the bonding layer can be formed in a similar manner as described above.

Although the embodiments of the present disclosure are described above, the present disclosure is not limited to the embodiments described above, and various improvements and changes may be made without departing from the scope of the present disclosure.

EXAMPLES

Hereinafter, the present disclosure is described in detail with Examples, but the present disclosure is not limited to the Examples below.

A plurality of LT substrates 2 as piezoelectric substrates and a plurality of sapphire substrates 3 as support substrates were prepared respectively. Then, using a lapping device, the second surface 2b of the LT substrate 2 was processed so that the arithmetic mean roughness Ra was 0.01 μm, and the third surface 3a of the sapphire substrate 3 was processed so as to obtain four levels of the arithmetic mean roughness Ra, which were 0.02 μm (Condition 1), 0.1 μm (Condition 2), 0.5 μm (Condition 3), and 2.5 μm (Condition 4). The alumina layer 4 was then film-formed on the processed third surface 3a with a thickness of approximately 1 μm by vapor deposition, and the fifth surface 4a of the alumina layer 4 was processed using a CMP system so that the arithmetic mean roughness Ra was 0.01 μm. The second surface 2b of the piezoelectric substrate 2 and the fifth surface 4a of the alumina layer 4' were activated by argon plasma and bonded to prepare the composite substrate 1.

Of the conditions 1 to 4, sufficient bonding strength (1.0 $N/m^2$ or more) could not be obtained in Condition 4. Furthermore, when the surface acoustic wave devices were prepared using the composite substrate 1 in the conditions 1 to 3, the spurious reduction effect due to the roughening of the third surface 3a was small in Condition 1, while good device characteristics were obtained in Conditions 2 and 3.

A plurality of LT substrates 2' as piezoelectric substrates and a plurality of sapphire substrates 3' as support substrates were prepared respectively. Then, using the lapping device, the second surface 2b' of the LT substrate 2' was processed so as to obtain four levels of the arithmetic mean roughness Ra, which were 0.02 μm (Condition 1), 0.1 μm (Condition 2), 0.5 μm (Condition 3), and 2.5 μm (Condition 4), and the third surface 3a' of the sapphire substrate 3' was processed so as to obtain the arithmetic mean roughness Ra of 0.01 μm. The bonding layer 4' composed of alumina by vapor deposition was then film-formed on the processed second surface 2b with a thickness of approximately 1 μm, and the sixth surface 4b' of the bonding layer 4' was processed using a CMP system so that the arithmetic mean roughness Ra was 0.01 μm. Then, the third surface 3a' of the sapphire substrate 3' and the sixth surface 4b' of the bonding layer 4' were activated by argon plasma and bonded to prepare the composite substrate 1.

Of the conditions 1 to 4, sufficient bonding strength (1.0 $N/m^2$ or more) could not be obtained in Condition 4. Furthermore, when the surface acoustic wave devices were prepared using the composite substrate 1' in the conditions 1 to 3, the spurious reduction effect due to the roughening of the second surface 2b' was small in Condition 1, while good device characteristics were obtained in Conditions 2 and 3.

DESCRIPTION OF THE REFERENCE NUMERALS 1, 1' composite substrate
2, 2' piezoelectric substrate
2a, 2a' first surface (element forming surface)

2b, 2b' second surface (back surface of piezoelectric substrate)
3, 3' sapphire substrate
3a, 3a' third surface (bonding surface of sapphire substrate)
3b, 3b' fourth surface (back surface of composite substrate)
4 bonding layer
4a fifth surface (surface of piezoelectric substrate side of bonding layer)
4b sixth surface (surface of sapphire substrate side of bonding layer)
4' alumina layer (bonding layer)
4a' fifth surface (surface of piezoelectric substrate side of alumina layer)
4b' sixth surface (surface of sapphire substrate side of alumina layer)

The invention claimed is:

1. A composite substrate comprising a piezoelectric substrate having a first surface which is an element formation surface and a second surface which is a back surface of the first surface,
a sapphire substrate having a third surface disposed opposing the second surface and a fourth surface which is a back surface of the third surface, and
a bonding layer having a fifth surface opposing the second surface and a sixth surface opposing the third surface and bonding the second surface to the third surface,
wherein the bonding layer is composed of a material selected from the group consisting of the same material as the piezoelectric substrate, alumina, and an oxide having a thermal expansion coefficient intermediate between the piezoelectric substrate and alumina,
an arithmetic mean roughness Ra of the third surface is 0.1 µm or more and 0.5 µm or less, and an arithmetic mean roughness Ra of the fifth surface is 0.1 µm or less and is smaller than an arithmetic mean roughness Ra of the third surface.

2. A composite substrate according to claim 1, wherein the bonding layer is polycrystal or amorphous.

3. A composite substrate according to claim 1, wherein the thickness of the bonding layer is 0.5 µm or more and 5.0 µm or less.

4. A piezoelectric device which comprises the composite substrate according to claim 1.

5. A piezoelectric device according to claim 4, which is a surface acoustic wave device.

6. A method for manufacturing a composite substrate comprising:
preparing a piezoelectric substrate having a first surface which is an element forming surface and a second surface which is a back surface of the first surface and a sapphire substrate having a third surface and a fourth surface which is a back surface of the third surface;
roughening the third surface so as to have an arithmetic mean roughness Ra of 0.1 µm or more and 0.5 µm or less;
forming a bonding layer on the roughened third surface;
processing a fifth surface which is an exposed surface located on an opposite side of the sapphire substrate of the bonding layer so as to have an arithmetic mean roughness Ra of 0.1 µm or less and to be smaller than an arithmetic mean roughness Ra of the third surface; and bonding the fifth surface of the bonding layer directly bonded to the second surface of the piezoelectric substrate;
wherein the bonding layer is composed of a material selected from the group consisting of the same material as the piezoelectric substrate, alumina, and an oxide having a thermal expansion coefficient intermediate between the piezoelectric substrate and alumina.

7. A composite substrate comprising:
a piezoelectric substrate having a first surface which is an element forming surface and a second surface which is a back surface of the first surface;
a sapphire substrate having a third surface which is disposed opposing the second surface and a fourth surface which is a back surface of the third surface; and
a bonding layer which is composed of a material selected from the group consisting of the same material as the piezoelectric substrate, alumina, and an oxide having a thermal expansion coefficient intermediate between the piezoelectric substrate and alumina, has a fifth surface opposing the second surface, a sixth surface opposing the third surface, and bonds the second surface to the third surface, wherein an arithmetic mean roughness Ra of the second surface is 0.1 µm or more and 0.5 µm or less, and an arithmetic mean roughness Ra of the sixth surface is 0.1 µm or less and is smaller than an arithmetic mean roughness Ra of the second surface.

8. A composite substrate according to claim 7, wherein the bonding layer is polycrystal or amorphous.

9. A composite substrate according to claim 7, wherein the thickness of the bonding layer is 0.5 µm or more and 5.0 µm or less.

10. A piezoelectric device which comprises the composite substrate according to claim 7.

11. A piezoelectric device according to claim 10, which is a surface acoustic wave device.

12. A method for manufacturing a composite substrate comprising:
preparing a piezoelectric substrate having a first surface which is an element forming surface and a second surface which is a back surface of the first surface and a sapphire substrate having a third surface and a fourth surface which is a back surface of the third surface;
roughening the second surface so as to have an arithmetic mean roughness Ra of 0.1 µm or more and 0.5 µm or less;
forming a bonding layer composed of a material selected from the group consisting of the same material as the piezoelectric substrate, alumina, and an oxide having a thermal expansion coefficient intermediate between the piezoelectric substrate and alumina on the roughened second surface;
processing the sixth surface which is an exposed surface located on the opposite side of the piezoelectric substrate of the bonding layer so as to have an arithmetic mean roughness Ra of 0.1 µm or less and to be smaller than an arithmetic mean roughness Ra of the second surface; and
pbonding the sixth surface of the bonding layer directly bonded to the third surface of the sapphire substrate.

* * * * *